United States Patent [19]

Taguchi et al.

[11] 4,456,838
[45] Jun. 26, 1984

[54] LEVEL SHIFTING CIRCUIT

[75] Inventors: Shinichiro Taguchi; Nobuya Nagao; Yutaka Ogihara, all of Fukaya, Japan

[73] Assignee: Tokyo Shibaura Denki Kabushiki Kaisha, Kawasaki, Japan

[21] Appl. No.: 238,025

[22] Filed: Feb. 25, 1981

[51] Int. Cl.³ .............................................. H03K 5/08
[52] U.S. Cl. ................. 307/264; 307/296 R; 307/475; 307/555; 330/261
[58] Field of Search ............... 307/264, 296 R, 297, 307/555, 557, 558, 475; 330/11, 259, 261, 296

[56] References Cited

U.S. PATENT DOCUMENTS

| | | | |
|---|---|---|---|
| 3,766,412 | 10/1973 | Takahashi et al. | 307/264 |
| 3,982,197 | 9/1976 | Schade, Jr. | 330/261 |
| 3,999,139 | 12/1976 | Fennell | 330/296 |
| 4,346,312 | 8/1982 | Christopherson | 307/475 |

Primary Examiner—John Zazworsky
Attorney, Agent, or Firm—Cushman, Darby & Cushman

[57] ABSTRACT

An output circuit and a biasing circuit for biasing an oscillation circuit comprise a current mirror circuit. The DC level of the output signal from the oscillation circuit is level shifted by controlling the current of the current mirror circuit comprising the biasing circuit and the output circuit. This control is performed by suitably determining the number of diodes and the resistances of the resistors making up the current mirror circuit. The biasing circuit of the oscillation circuit may thus be utilized as the level shifting circuit, the DC level of the output signal of the oscillation circuit may be set to a predetermined level, and fluctuations in the duty ratio of the oscillation output may be suppressed.

4 Claims, 6 Drawing Figures

LEVEL SHIFTING CIRCUIT

This invention relates to a level shifting circuit. When transmitting the output of an oscillation circuit to a circuit of the next stage, the DC level of the oscillation output signal must correspond with the optimal driving condition of the circuit of the next stage. That is to say, it may be necessary to DC level shift the oscillation output signal so that it may correspond with the optimal driving condition of the circuit of the next stage. When the DC level is lowered by this level shifting, the oscillation signal is also attenuated. This results in a disadvantage in that the predetermined signal may not be obtained as the output of the next stage when there are fluctuations in the amount of the DC level shift. Accordingly, it is necessary to level shift the oscillation output signal to amplify the attenuated signal and then to DC level shift to transmit the output of the oscillation circuit to the circuit of the next stage.

When DC level shifting the output of the oscillation circuit, the attenuated oscillation signal must be amplified. A level shifting circuit for raising the DC level of the output of the oscillation circuit to a predetermined value is thus desired.

It is an object of the present invention to provide a level shifting circuit which includes a biasing circuit of a signal generating circuit and which is capable of constantly providing a predetermined level shifting amount for every level shifting operation.

It is another object of the present invention to provide a level shifting circuit which is of the circuit configuration wherein a current equal to the current flowing through the biasing circuit for biasing the signal source circuit is supplied to the output stage of the signal generating circuit by a current mirror circuit; and which is capable of suitably transmitting the output signal of the signal generating circuit to the circuit of the next stage by determining the current value to flow through the current mirror circuit.

This invention can be more fully understood from the following detailed description when taken in conjunction with the accompanying drawings, in which.

The present invention relates to a level shifting circuit of the circuit configuration in which the biasing circuit of the signal generating circuit is used for shifting the DC level of the output signal.

When transmitting the signal of the signal generating circuit to the circuit of the next stage, the DC output level of the signal generating circuit must correspond with the predetermined operating point of the circuit of the next stage. That is, a level shifting circuit is required for the signal generating circuit to shift the DC level of the output signal of the signal generating circuit according to the DC operating point of the circuit of the next stage. When the level shifting is performed on the output of the signal generating circuit to lower the DC level, the signal component is also attenuated. Accordingly, a level shifting circuit is desired with which the adverse effects provided to the output signal by the DC level shifting operation are eliminated.

The present invention has been made to overcome the problems associated with DC level shifting of the signal by utilizing, in the level shifting circuit, a biasing circuit of the signal generating circuit. The various features and advantages of the present invention will become apparent from the detailed description of the invention to follow.

Figure 1:
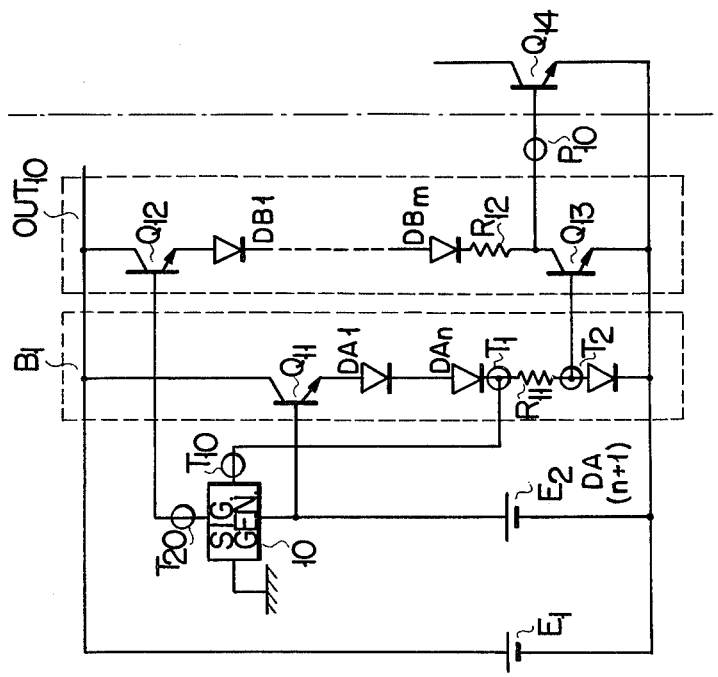
FIG. 1 is a circuit diagram illustrating an embodiment of the level shifting circuit of the present invention.

FIG. 1 is a circuit diagram illustrating an embodiment of the level shifting circuit of the present invention.

Referring to FIG. 1, reference numeral 10 denotes a signal generating circuit for generating signals, which is biased by a voltage source E1. A voltage source E2 provides a voltage depending on the biasing voltage source E1 and biases one biasing circuit B1 among the biasing circuits of the signal generating circuit 10. The biasing circuit B1 comprises a transistor Q11 whose base is biased by the voltage source E2 and whose collector is biased by the voltage source E1; and diodes DA1 to DA(n+1) and a resistor R11 connected to the emitter side of the transistor Q11. A node T1 of the resistor R11 and the diode DAn of the biasing circuit B1 is connected to a terminal T10 of the signal generating circuit 10 in such a manner that a biasing voltage is supplied to the signal generating circuit 10. The signal generating circuit 10 outputs an output signal from a terminal T20 with the DC level E2. A node T2 of the diode DA(n+1) and the resistor R11 of the biasing circuit B1 is connected to the base of a transistor Q13 connected in series with a transistor Q12 forming an output circuit OUT10 which functions as an output stage circuit for the signal generating circuit 10, thus comprising a current mirror circuit. A series circuit of diodes $DB_1 \ldots DB_n$ and a resistor R12 are connected between the emitter of the transistor Q12 and the collector of the transistor Q13. The resistances of the resistors R11 and R12, the number of diodes in the biasing circuit B1, and the number of diodes in the output circuit OUT10 are so selected that the DC level across a node P10 between the resistor R12 and the collector of the transistor Q13 of the output circuit OUT10 becomes VF (forward voltage of the diodes).

In FIG. 1, it is to be noted that the biasing circuit B1 and the output circuit OUT10 for the signal generating circuit 10 comprises a current mirror circuit and a level shifting circuit at the same time. With this construction, the DC level across the output terminal P10 of the output circuit may be held at a constant voltage VF, as will be described hereinafter.

Describing the mode of operation of the level shifting circuit of the present invention shown in FIG. 1, the collector current I0 of the transistor Q11 whose base is biased by the voltage source E2 may be represented by the following equation:

$$I0 = \frac{E2 - (n+2)VF}{R11} \quad (1)$$

where it is assumed that the characteristics of the diodes numbering (n+1) of the biasing circuit B1 are the same as those of the diode formed by the base and the emitter of the transistor Q11.

The terminal voltage (VF+R11·I0) across the terminal T1 of the biasing circuit B1 through which the current I0, represented by equation (1) flows is applied to the terminal T10 of the signal generating circuit 10 as a biasing voltage.

Since the diode DA(n+1) of the biasing circuit B1 and the transistor Q13 of the output circuit OUT10 are connected to form a current mirror circuit, the collector current of the transistor Q13 is equal to the current represented by equation (1) (provided that the characteristics of the diode DA(n+1) are equal to the base-emitter characteristics of the transistor Q13). From this, the level shifting amount ΔV by the diodes DB1 to DBm, the resistor R12, and the transistor Q13 of the output circuit OUT10 may be represented by the following equation:

$$\Delta V = mVF + \frac{R12}{R11}\{E2 - (n+2)VF\}. \quad (2)$$

When it is assumed that an AC signal is superposed on the DC voltage E2 at the output terminal T20 of the signal generating circuit 10, the DC level VP10 across the terminal P10 of the output circuit OUT10 may be represented from equations (1) and (2) as follows:

$$VP10 = (E2 - VF) - \Delta V \quad (3)$$

$$= \left(1 - \frac{R12}{R11}\right) E2 \left[(m+1) - \frac{R12}{R11}(n+2)\right] VF$$

If $R11 = R12$, and $m = n$, $\quad (4)$ $VP10 = VF$

It thus follows from this that the DC voltage level across the terminal P10 of the output circuit OUT10 may be held at VF if the resistances of the resistors R11 and R12 are equal to each other and if the number of diodes connected between the emitter of the transistor Q11 and the resistor R11 of the biasing circuit B1 is equal to the number of diodes connected between the emitter of the transistor Q12 and the resistor R12 of the output circuit OUT10. The DC level across the terminal P10 of the output circuit OUT10 is not affected by fluctuations in the DC level across the terminal T20 of the signal generating circuit 10. Therefore, a drive transistor Q14 of the circuit of the next stage may be driven in a stable manner without being affected by fluctuations in the biasing power source of the signal generating circuit.

Figure 2:
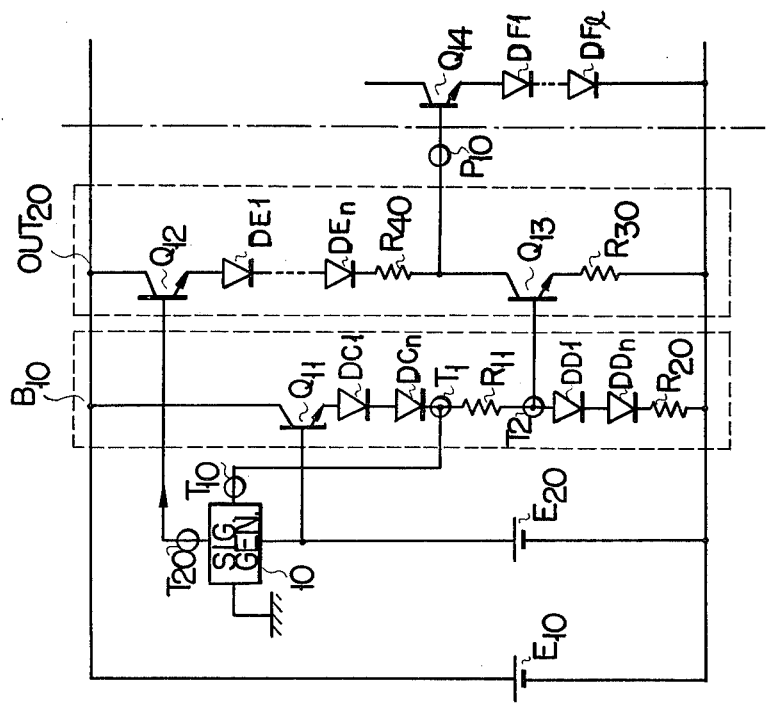
FIG. 2 is a circuit diagram illustrating another embodiment of the level shifting circuit of the present invention.

FIG. 2 is a circuit diagram illustrating another embodiment of the level shifting circuit of the present invention. The basic configuration is the same as that of the circuit shown in FIG. 1. The circuit shown in FIG. 1 is different from that shown in FIG. 2 in that a plurality of diodes DD1 to DDn2 are connected between the terminal T2 of the biasing circuit B10 and the ground potential, a resistor R30 is connected at the emitter side of the transistor Q13, and diodes DF1 to DF(m+1) are connected to the drive transistor Q14 of the circuit of the next stage. Although the potential of the terminal P10 was VF in the circuit shown in FIG. 1, in the circuit shown in FIG. 2, the DC level of the terminal P10 is set at a voltage which is different from VF.

Describing the mode of operation of the circuit shown in FIG. 2, the voltage across the terminal T2 of the biasing circuit B10, that is, the base voltage V1 of the transistor Q13 of the output circuit OUT20, may be represented by equation (5) below:

$$V1 = \frac{R20}{R11 + R20} E2 + \quad (5)$$

$$\left\{ n2 - \frac{R20}{R11 + R20}(n1 + n2 + 1) \right\} VF$$

where n1 is the number of diodes connected between the emitter of the transistor Q11 and the resistor R11, and n2 is the number of diodes connected between the terminal T2 and the ground potential.

The voltage across the terminal T1 of the biasing circuit B10 is applied to the terminal T10 of the signal generating circuit 10 as a biasing voltage. Taking into account that the AC signal is superposed on the DC level E20 across the terminal T20 of the signal generating circuit 10, the voltage V2 across the collector of the transistor Q13 of the output circuit OUT20, that is, the DC voltage level across the terminal P10, may be represented by equation (6) below:

$$V2 = E20 - (n3 + 1)VF - (V1 - VF)\frac{R40}{R30} \quad (6)$$

$$= \left(1 - \frac{R20}{R11 + R12} \cdot \frac{R40}{R20}\right) E2 - VF\left\{ n3 + 1 - \right.$$

$$\left. \frac{R40}{R30} \cdot \frac{R20}{R11 + R20}(n1 + n2 + 1) - \frac{R40}{R30}(n2 - 1) \right\}$$

If the resistors R11, R20 and R30 have such resistances as would satisfy the following equation (7), the DC level variation at the terminal T20 of the signal generating circuit 10 will not affect the DC level at the terminal P10 of the output circuit OUT20.

$$\frac{R20}{R11 + R20} \cdot \frac{R40}{R30} = 1 \quad (7)$$

If equation (7) is satisfied, equation (6) will be transformed as follows:

$$V2 = \left(1 - \frac{R40}{R30}\right) n2 + \left(n1 - n3 + \frac{R40}{R30}\right) VF \quad (8)$$

The DC level at the terminal P10 of the output circuit OUT20 is expressed by equation (8). Voltage necessary for operating the drive circuit of the next stage is determined by various factors such as voltage ratio of the resistors R40 and R30, the number n1 of diodes to be connected between the emitter of the transistor Q11 and the terminal T2, the number n2 of diodes to be connected between the terminal T2 and the ground potential and the number n3 of diodes to be connected between the emitter of the transistor Q12 and the terminal P10. Here, it is necessary to select the resistance ratios R40/R30 and n1, n2 and n3—all in equation (8)—in order to satisfy equation (7).

In the circuit of FIG. 2 it is sufficient to choose the DC level at the terminal P10 to be mVF in order to drive the signal generating circuit 10 and the transistor Q14 of the next stage circuit. That is, if R40/R30 and n1, n2 and n3 appearing in equation (8) are of such values as satisfy equation (7) and as provide DC level of M1VF at the terminal P10, the DC level of the output circuit OUT20 will be M1VF, now matter how the change of the DC level at the terminal T20 of the signal generating circuit 10.

Examples of constants which satisfy the conditions of equations (7) and (8) in FIG. 2 will be shown below:

when $m1 = 2$,                      (i)

$R11 = 1\ k\Omega,\ R20 = 1\ k\Omega,\ R30 = 1\ k\Omega,\ R40 = 2\ k\Omega,$ $V2 = 2VF$ if $n1 = 2, n2 = 2,$ and $n3 = 0$ when $m1 = 3$                       (ii)

Figure 3:
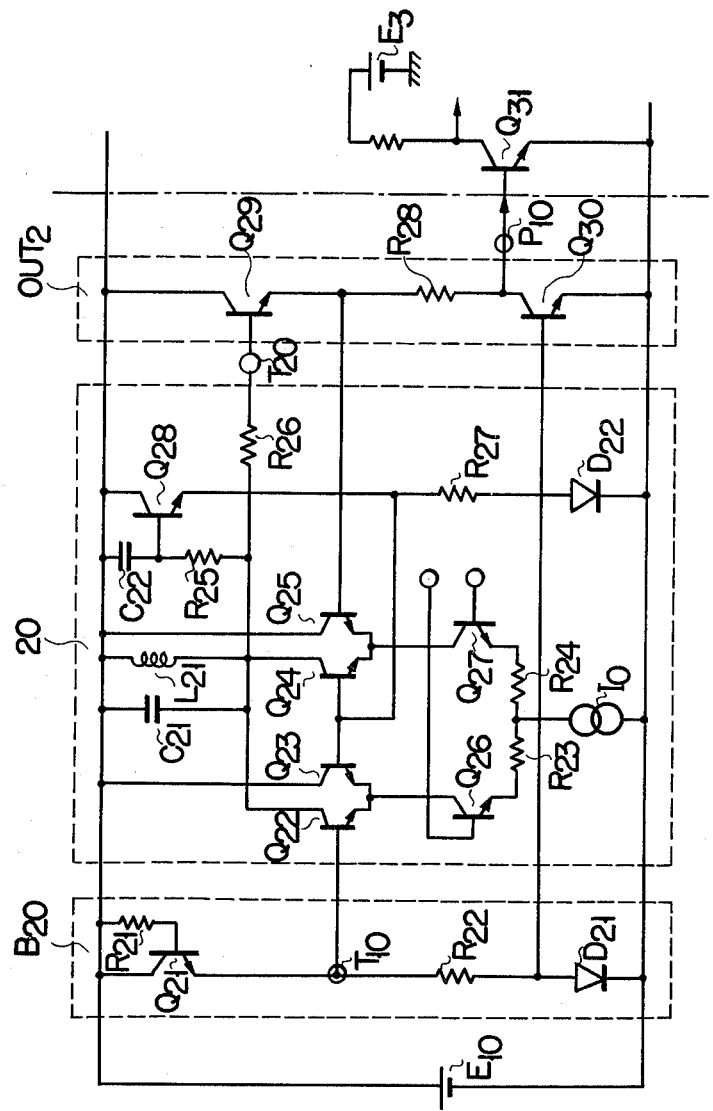
FIG. 3 is a circuit diagram illustrating a case wherein the first embodiment of the level shifting circuit of the present invention is applied to an oscillation circuit.

$R11 = 1\ k\Omega,\ R20 = 1\ k\Omega,\ R30 = 1\ k\Omega,\ R40 = 2\ k\Omega$ $V2 = 3VF$ if $n1 = 3, n2 = 2,$ and $n3 = 0$ FIG. 3 is a circuit diagram illustrating a case wherein the level shifting circuit of the present invention is applied to an oscillation circuit. In this circuit diagram, the signal generating circuit 10 in FIG. 1 is replaced by an oscillation circuit.

Referring to FIG. 3, E10 is a voltage source. The collector of a transistor Q21 is connected to the voltage source E10 and the base of it is connected to the voltage source E1 through a resistor R21. The emitter of the transistor Q21 is connected to the ground potential through a series circuit of a resistor R22 and a diode D21 as well as to the base of a transistor Q22. The circuit consisting of the transistor Q21, the resistors R21 and R22, and the diode D21 comprise the biasing circuit B20 for biasing the base of the transistor Q22.

An oscillation circuit 20 surrounded by a broken line corresponds to the signal generating circuit 10 in FIG. 1. This oscillation circuit 20 comprises a differential amplifier including transistors Q22 to Q27, resistors R23 and R24, and a constant current source I0; a resonance circuit consisting of a capacitor connected to a common terminal of the collectors of the transistors Q22 and Q24, and a coil L21; a phase shifting circuit consisting of a capacitor C22 and a resistor R25; a transistor Q28 whose base is connected to this phase shifting circuit and whose emitter is connected to the ground potential through a resistor R27 and a diode D22 as well as to the bases of the transistors Q23 and Q24; and a resistor R26 connected between the collectors of the transistors Q22, Q24 and the terminal T20. A control voltage for controlling the oscillation frequency is applied between the base electrodes of the transistors Q26 and Q27.

An output circuit OUT30 comprises a transistor Q29 whose base is connected to the terminal T20, a transistor Q30 making up a current mirror configuration together with the diode D21 of the biasing circuit B20, and a resistor R28 connected between the collector of the transistor Q30 and the emitter of the transistor Q29. A transistor Q31 is the drive transistor of the circuit of the next stage.

Figure 4:
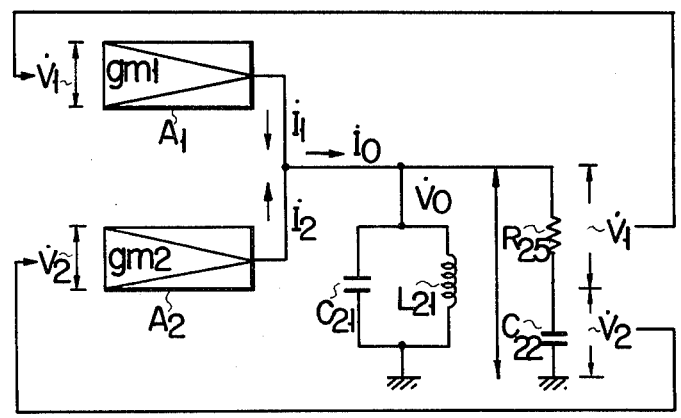
FIG. 4 is a block diagram for showing the mode of operation of the oscillation circuit shown in FIG. 3.

An equivalent circuit for the oscillation circuit 20 of the configuration described above is shown in FIG. 4. Referring to FIG. 4, symbols A1 and A2 are transconductance amplifiers, comprising differential amplifiers and having transconductances gm1 and gm2, respectively. The transconductances gm1 and gm2 are differentially controlled by the control voltage applied to the bases of the transistors Q26 and Q27 shown in FIG. 3. The resonance circuit (C21, L21) and the phase shifting circuit (C22, R25) shown in FIG. 3 are connected in an equivalent circuit with the transconductance amplifiers A1 and A2 in the manner shown in FIG. 4.

Figure 5:
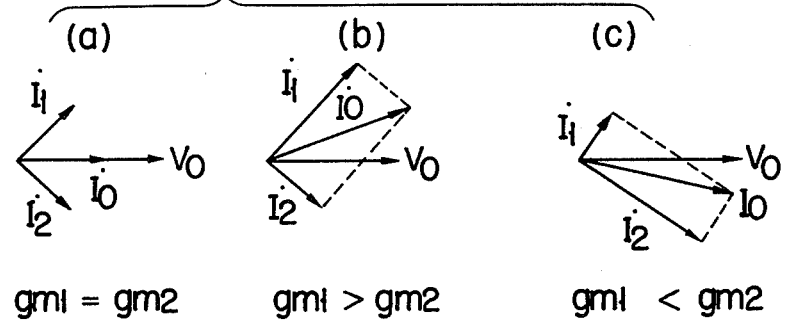
FIG. 5 is a vector model diagram for showing the mode of operation of the oscillation circuit shown in FIG. 3.

In FIG. 4, the values of the respective elements of the phase shifting circuit (C22, R25) are so determined that $$\omega 0 C22 = 1/R25 \quad\quad\quad (9)$$

where the resonance frequency of the resonance circuit is $\omega 0$. The voltage vector and the current vector across the output terminal of the resonance circuit are represented as $\dot{V}0$ and $\dot{I}0$; the voltage vector across the resistor R25, $\dot{V}1$; and the voltage vector across the capacitor C22, $\dot{V}2$. These voltage vectors $\dot{V}1$ and $\dot{V}2$ are fed back to the transconductance amplifiers A1 and A2, respectively, to control the values of the transconductances gm1 and gm2. The transconductances gm1 and gm2 are controlled by the control voltage vc described above. Referring to FIG. 5, when oscillating at the central angle frequency $\omega 0$, the vector $\dot{V}1$ is advanced by $\pi/4$ with respect to the reference $\dot{V}0$ and the vector $\dot{V}2$ is out of phase by $\pi/4$ with respect to the reference vector $\dot{V}0$. These voltage vectors $\dot{V}1$ and $\dot{V}2$ are fed back to the transconductance amplifiers A1 and A2, respectively, to be converted into the current vectors $\dot{I}1$ and $\dot{I}2$ as shown in FIG. 5(a). When the control voltage vc is 0 at this time, the absolute values of these vectors $\dot{I}1$ and $\dot{I}2$ are equal to each other so that the oscillation is performed at the central angle frequency $\omega 0$. When control is performed such that $vc > 0$ and $gm1 > gm2$, oscillation is capacitive (FIG. 5(b)). When the control voltage $vc < 0$ and $gm1 < gm2$, the conditions for inductive oscillation are satisfied (FIG. 5(c)). The oscillation frequency may thus be varied by varying the control voltage.

The output of the oscillation circuit 20 is level shifted by the output circuit OUT30 through the resistor R26. This will now be described in more detail.

As has already been described, the diode D21 of the biasing circuit B20 and the transistor Q30 of the output circuit OUT30 comprise a current mirror circuit. The current I10 flowing through the biasing circuit B20 and the collector current of the transistor Q30 are equal to each other. Since the current flowing through the resistor R21 is extremely small, when the base voltage of the transistor Q21 is approximately equal to the voltage of the voltage source E10, current I10 flowing through the biasing circuit may be represented by the following equation:

$$I10 = \frac{E10 - 2VF}{R22} \quad\quad\quad (9)$$

The approximation used to obtain equation (9) corresponds to an approximation of $E1 \approx E2$ in FIG. 2. The voltage (E20−VF) across the terminal T10, to which is connected the resistor R22 through which the current I10 represented by equation (9) flows, is utilized as a voltage for biasing the transistor Q22 of the oscillation circuit 20.

As has already been described, the collector current of the transistor Q30 of the output circuit OUT30 is represented by equation (9), and the collector voltage V3 of the transistor Q30 is represented by equation (10)

below. It may be approximated that the voltage of E10 is applied to the base of the transistor Q29, neglecting the voltage drop across the resistor R26. Therefore, the voltage V3 at the terminal P10 may be represented by the following equation:

$$V3 = E10 - VF - (E10 - 2VF) \times \frac{R28}{R22} \qquad (10)$$

$$= \left(1 - \frac{R28}{R22}\right) E10 - \left(1 - \frac{2R28}{R22}\right) VF$$

When the values of the resistors R22 and R28 are so selected to satisfy R22=R28 ... (11) in equation (10), the DC level across the output circuit P10 may be held at the constant voltage VF, regardless of fluctuations in the DC level across the base of the transistor Q29. The drive transistor Q31 of the circuit of the next stage may thus be driven in a stable manner.

It has already been described that one of the features of the level shifting circuit of the present invention is that the biasing circuit also functions as the level shifting circuit. For the sake of simplicity, the mode of operation for level shifting alone is illustrated in FIG. 6.

Figure 6:
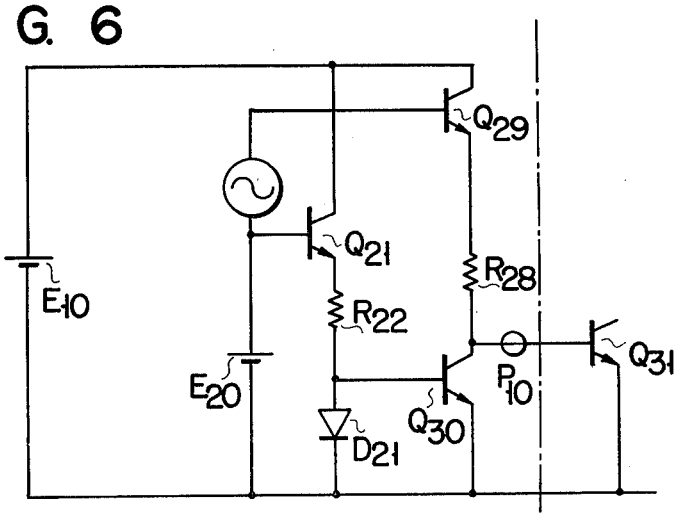
FIG. 6 is a circuit diagram for showing the mode of the level shifting operation in the case wherein the level shifting circuit of the present invention is applied to the oscillation circuit.

According to FIG. 6, the output circuit OUT30 is biased by the voltage source E10, and the output signal of the oscillation circuit 20 is superposed on the DC level of E20. Since E10 was approximated by the DC level across the terminal T10 which is the base of the transistor Q29 when obtaining equation (10), the DC level E20 holds the relation, E10≈E20. As has been described, in FIG. 6, the DC level of the terminal P10 is level shifted to the constant DC level VF. Therefore, it is seen from FIG. 6 that the level shifting circuit of the present invention is capable of level shifting the DC level to a predetermined DC level compatible with the drive circuit of the circuit of the next stage, even when there are voltage fluctuations in the DC level of E10 before level shifting.

What we claim is:

1. A level shift circuit comprising:
   a first transistor having a base terminal, a collector terminal and an emitter terminal, said base terminal being biased at a first DC level and being coupled to a signal source circuit, said collector terminal being biased at a second DC level and said emitter terminal being connected to a first current branch;
   a second transistor having base, collector and emitter terminals, said collector terminal of said second transistor being connected to said second DC level, said base terminal being connected to the first DC level and said emitter terminal being connected to a second current branch;
   a current mirror connected between said first and second current branches, whereby substantially equal current flows therethrough; and
   an output terminal connected to said first branch for delivering an AC signal therefrom and wherein each of said first and second current branches include a series of diodes and a resistor.

2. A level shift circuit according to claim 1, which further comprises at least one p-n junction disposed between said output terminal and a reference potential.

3. A level shift circuit according to claim 12, wherein said current mirror circuit is composed of a diode connected to said second current branch and a transistor having a collector connected to said first current branch, and a base connected at a junction of said second current branch and said diode.

4. A level shift circuit according to claim 3, wherein a node of said second branch is adapted to be connected to said signal source circuit.

* * * * *